US012639499B2

(12) United States Patent
Sato

(10) Patent No.: US 12,639,499 B2
(45) Date of Patent: May 26, 2026

(54) INFORMATION PROCESSING SYSTEM AND METHOD FOR CONTROLLING COMPONENT MOUNTER

(71) Applicant: Panasonic Intellectual Property Management Co., Ltd., Osaka (JP)

(72) Inventor: Taichi Sato, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 1282 days.

(21) Appl. No.: 17/442,091

(22) PCT Filed: Feb. 21, 2020

(86) PCT No.: PCT/JP2020/007006
§ 371 (c)(1),
(2) Date: Sep. 22, 2021

(87) PCT Pub. No.: WO2020/195419
PCT Pub. Date: Oct. 1, 2020

(65) Prior Publication Data
US 2022/0172116 A1     Jun. 2, 2022

(30) Foreign Application Priority Data

Mar. 27, 2019   (JP) ................................ 2019-061933

(51) Int. Cl.
*G06F 30/347*       (2020.01)
*G06F 30/27*       (2020.01)
(Continued)

(52) U.S. Cl.
CPC ............ *G06F 30/347* (2020.01); *G06F 30/27* (2020.01); *G06F 30/30* (2020.01); *G06F 30/39* (2020.01);
(Continued)

(58) Field of Classification Search
CPC .......... G06N 20/00; G06N 3/06; G06N 3/098; G06N 3/045; G06N 3/0464; G06N 3/08;
(Continued)

(56) References Cited

U.S. PATENT DOCUMENTS

| | | | | |
|---|---|---|---|---|
| 12,036,634 B2 * | 7/2024 | Takeda | .................. | B24B 37/005 |
| 2015/0290766 A1 * | 10/2015 | Sugiyama | ............. | B24B 53/007 |
| | | | | 451/444 |

(Continued)

FOREIGN PATENT DOCUMENTS

WO      WO-2020080504 A1 *   4/2020   ............. G16H 40/67

OTHER PUBLICATIONS

Bonawitz et al., "Towards Federated Learning at Scale: System Design" Mar. 22, 2019, arXiv: 1902.01046v2, pp. 1-15. (Year: 2019).*

(Continued)

*Primary Examiner* — Miranda M Huang
*Assistant Examiner* — Chase P. Hinckley
(74) *Attorney, Agent, or Firm* — Rimon P.C.

(57)          ABSTRACT

An information processing system includes a first system and a second system which are ready to communicate with each other. The first system transforms first data including specific information into second data not including the specific information and outputs the second data to the second system. The second system performs machine learning using the second data to generate a second learning deliverable and outputs the second learning deliverable to the first system. The first system obtains, based on at least a part of the first data and the second learning deliverable provided by the second system, the first learning deliverable.

9 Claims, 4 Drawing Sheets

(51) Int. Cl.

| | |
|---|---|
| *G06F 30/30* | (2020.01) |
| *G06F 30/39* | (2020.01) |
| *G06N 3/06* | (2006.01) |
| *G06N 3/098* | (2023.01) |
| *G06N 20/00* | (2019.01) |
| G06N 3/045 | (2023.01) |
| G06N 3/0464 | (2023.01) |
| G06N 3/08 | (2023.01) |
| G06N 3/092 | (2023.01) |

(52) U.S. Cl.
CPC .............. *G06N 3/06* (2013.01); *G06N 3/098* (2023.01); *G06N 20/00* (2019.01); *G05B 2219/36195* (2013.01); *G06N 3/045* (2023.01); *G06N 3/0464* (2023.01); *G06N 3/08* (2013.01); *G06N 3/092* (2023.01)

(58) Field of Classification Search
CPC ....... G06N 3/092; G06F 30/347; G06F 30/27; G06F 30/30; G06F 30/39; G05B 2219/36195
See application file for complete search history.

(56) References Cited

U.S. PATENT DOCUMENTS

| | | | | |
|---|---|---|---|---|
| 2017/0061311 | A1 | 3/2017 | Liu | |
| 2019/0155164 | A1* | 5/2019 | Chen | .................. G01N 21/8851 |
| 2019/0354567 | A1* | 11/2019 | Dehghani | .............. G06N 3/044 |
| 2020/0285980 | A1* | 9/2020 | Sharad | ................... G06N 3/098 |
| 2020/0302321 | A1* | 9/2020 | Veda | ...................... G06F 30/367 |
| 2020/0349473 | A1* | 11/2020 | Idesawa | .................. G06N 5/01 |
| 2021/0391077 | A1* | 12/2021 | Hirai | ................... G06F 21/6245 |

OTHER PUBLICATIONS

Nishio et Yonetani, "Client Selection for Federated Learning with Heterogeneous Resources in Mobile Edge" Oct. 30, 2018, arXiv: 1804.08333v2, pp. 1-7. (Year: 2018).*

Dehghani et al., "Universal Transformers" Mar. 5, 2019, arXiv: 1807.03819v3, pp. 1-23. (Year: 2019).*

Tanaka, Satoshi, et al., "Cost Evaluation of Neural Network using Secret-sharing-based Secure Computation," IEICE Technical Report, May 19, 2016, vol. 116, No. 6, pp. 119-126, ISSN: 0913-5685; with partial English translation and Concise explanation of relevance.

Une, Masashi, et al., "Research Trends on Vulnerability and Countermeasures in Machine Learning Systems," Proceedings of Computer Security Symposium 2018, Tokyo: Information Processing Society of Japan, Oct. 15, 2018, vol. 2018, No. 2, pp. 193-200; with partial English translation and Concise explanation of relevance.

International Search Report and Written Opinion issued in International Patent Application No. PCT/JP2020/007006, dated May 12, 2020; with partial English translation.

* cited by examiner

INFORMATION PROCESSING SYSTEM AND METHOD FOR CONTROLLING COMPONENT MOUNTER

CROSS-REFERENCE OF RELATED APPLICATIONS

This application is the U.S. National Phase under 35 U.S.C. § 371 of International Patent Application No. PCT/JP2020/007006, filed on Feb. 21, 2020, which in turn claims the benefit of Japanese Application No. 2019-061933, filed on Mar. 27, 2019, the entire disclosures of which Applications are incorporated by reference herein.

TECHNICAL FIELD

The present disclosure generally relates to an information processing system, a computer system, an information processing method, and a program. More particularly, the present disclosure relates to an information processing system, a computer system, an information processing method, and a program, all of which are configured or designed to perform machine-learning-related processing.

BACKGROUND ART

Patent Literature 1 teaches a method for providing data analysis service. In Patent Literature 1, data collected by a company (data owner) is transmitted, as training data, to a data analysis service provider. The service provider generates a model (learned model) by analyzing the data and sends the model back to the data owner. This allows the data owner to make, for example, a prediction by using the model. In addition, Patent Literature 1 also teaches preserving business confidential information by anonymizing, when generating the training data, variables of the data collected by the data owner.

In this manner, in Patent Literature 1, the machine learning is performed by using the training data generated based on the collected data which does not include the business confidential information (specific information). However, this type of machine learning may cause a decline in learning effectiveness because the specific information is missing.

CITATION LIST

Patent Literature

Patent Literature 1: US 2017/0061311 A

SUMMARY OF INVENTION

The problem is to provide an information processing system, a computer system, an information processing method, and a program, all of which contribute to increasing learning effectiveness of machine learning while taking measures for preserving information securely.

An information processing system according to an aspect of the present disclosure is an information processing system for generating a first learning deliverable based on first data including specific information. The information processing system includes a first system and a second system which are ready to communicate with each other. The first system includes a transformation unit which transforms the first data into second data not including the specific information and outputs the second data to the second system. The second system includes a learning unit which performs machine learning using the second data provided by the first system to generate a second learning deliverable and outputs the second learning deliverable to the first system. The first system includes a generation unit which obtains, based on at least a part of the first data and the second learning deliverable provided by the second system, the first learning deliverable.

A computer system according to another aspect of the present disclosure is a computer system functioning as the first system of the information processing system described above.

A computer system according to still another aspect of the present disclosure is a computer system functioning as the second system of the information processing system described above.

An information processing method according to yet another aspect of the present disclosure is an information processing method for generating a first learning deliverable based on first data including specific information. The information processing method according to this aspect includes transforming the first data into second data that does not include the specific information, generating a second learning deliverable by performing machine learning using the second data, and obtaining, based on at least a part of the first data and the second learning deliverable, the first learning deliverable.

A program according to still another aspect of the present disclosure is designed to cause one or more processors to perform the information processing method described above.

DESCRIPTION OF EMBODIMENTS

1. Embodiments

1.1 Overview

Figure 1:
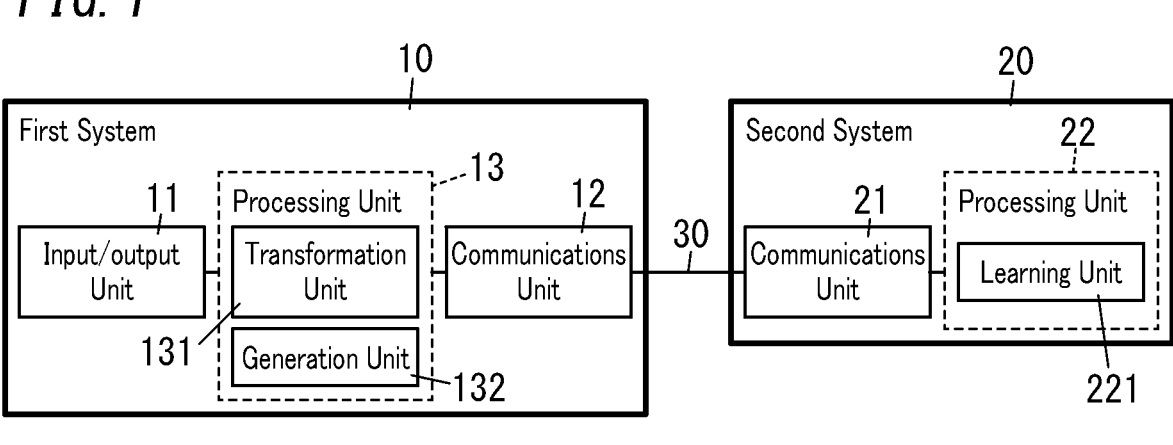
FIG. 1 is a block diagram of an information processing system according to an exemplary embodiment.
Figure 4:
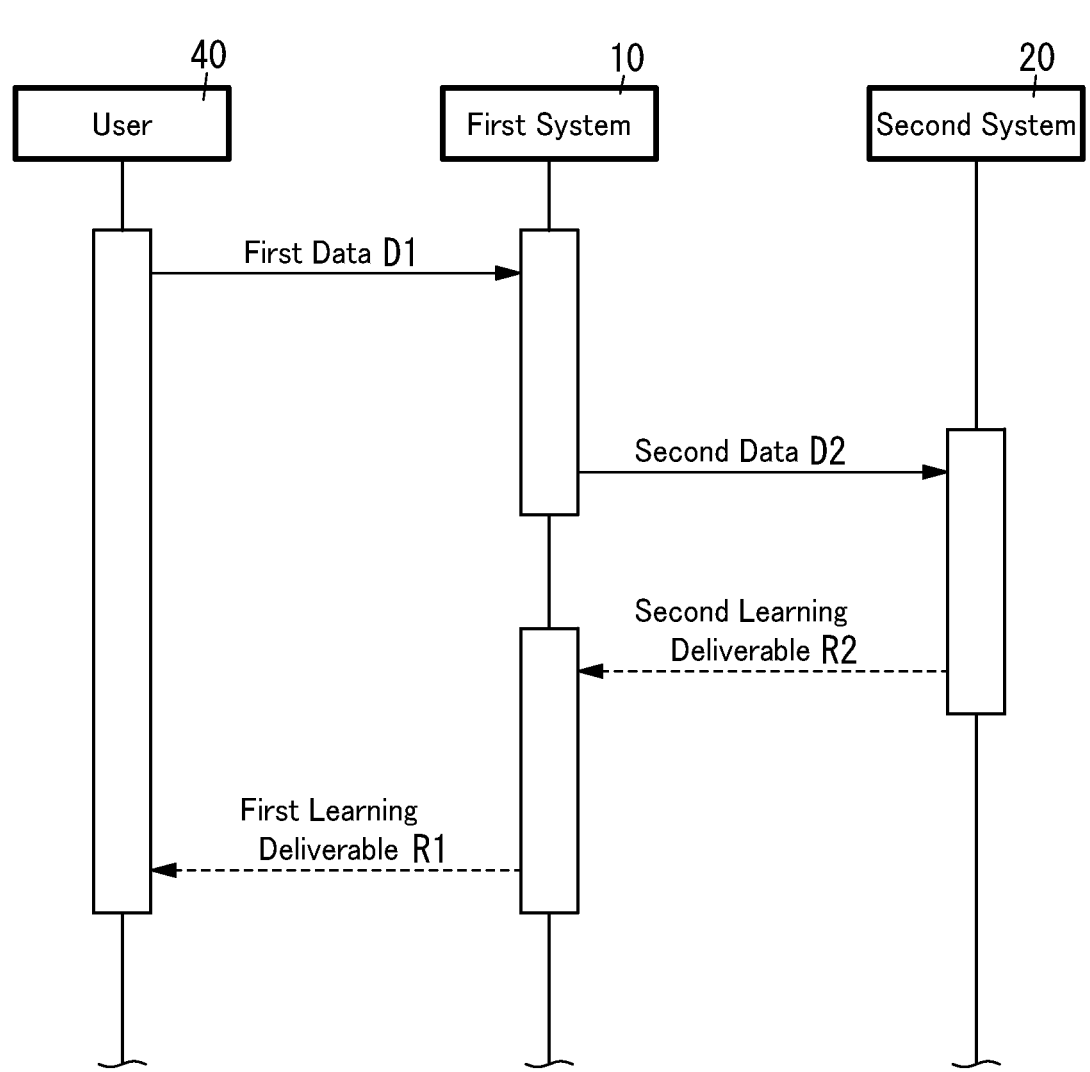
FIG. 4 is a sequence chart for the information processing system.

FIG. 1 shows an information processing system 100 according to an exemplary embodiment. As shown in FIG. 4, the information processing system 100 is an information processing system for generating a first learning deliverable R1 based on first data D1 including specific information. The information processing system 100 includes a first system 10 and a second system 20 which are ready to communicate with each other. As shown in FIG. 1, the first system 10 includes a transformation unit 131 which transforms the first data D1 into second data D2, not including the specific information, and which outputs the second data D2 to the second system 20. The second system 20 includes a learning unit 221 which performs machine learning using the second data D2 provided by the first system 10 to generate a second learning deliverable R2 and output the second learning deliverable R2 to the first system 10. The first system 10 includes a generation unit 132 which obtains, based on at least a part of the first data D1 and the second learning deliverable R2 provided by the second system 20, the first learning deliverable R1.

This information processing system 100 uses the second data D2 without the specific information, instead of the first data D1 with the specific information, when the machine learning is performed by the second system 20 which is ready to communicate with the first system 10. That is to say, the machine learning may be performed by the second system 20 with the specific information held in the first system 10. Therefore, the second system 20 may use, with no need to care about preservation of information, a computational resource having higher computing power than the first system 10 and installed at a different facility from a facility where the first system 10 is installed. Meanwhile, the first system 10 obtains the first learning deliverable R1 based on the second learning deliverable R2 provided by the second system 20 and at least a part of the first data D1. Therefore, the specific information not included in the second data D2 that has been used for the machine learning by the second system 20 may be reflected in the first learning deliverable R1. Thus, this information processing system 100 allows increasing the learning effectiveness of machine learning while taking measures for preserving information securely.

1.2. Details

Next, the information processing system 100 will be described in further detail with reference to FIGS. 1-4.

The information processing system 100 is configured to generate the first learning deliverable R1 based on the first data D1 (see FIG. 4).

The first data D1 is data representing a mount board 300 (see FIGS. 2 and 3) where a plurality of electronic components 320 are mounted on a board (circuit board) 310. The first data D1 may contain various types of information about the shapes and sizes of the board 310 and the plurality of electronic components 320, the types of the board 310 and the plurality of electronic components 320, the arrangement of the plurality of electronic components 320 (specifically, their arrangement on the board 310), and the arrangement of an electrical path (circuit pattern) of the board 310. A copper-clad laminate may be cited as an example of the board 310. Examples of the electronic components 320 include resistors, capacitors, coils, diodes, transformers, IC chips, connectors, and switches. The first data D1 may be, for example, CAD data for the mount board 300.

Figure 2:
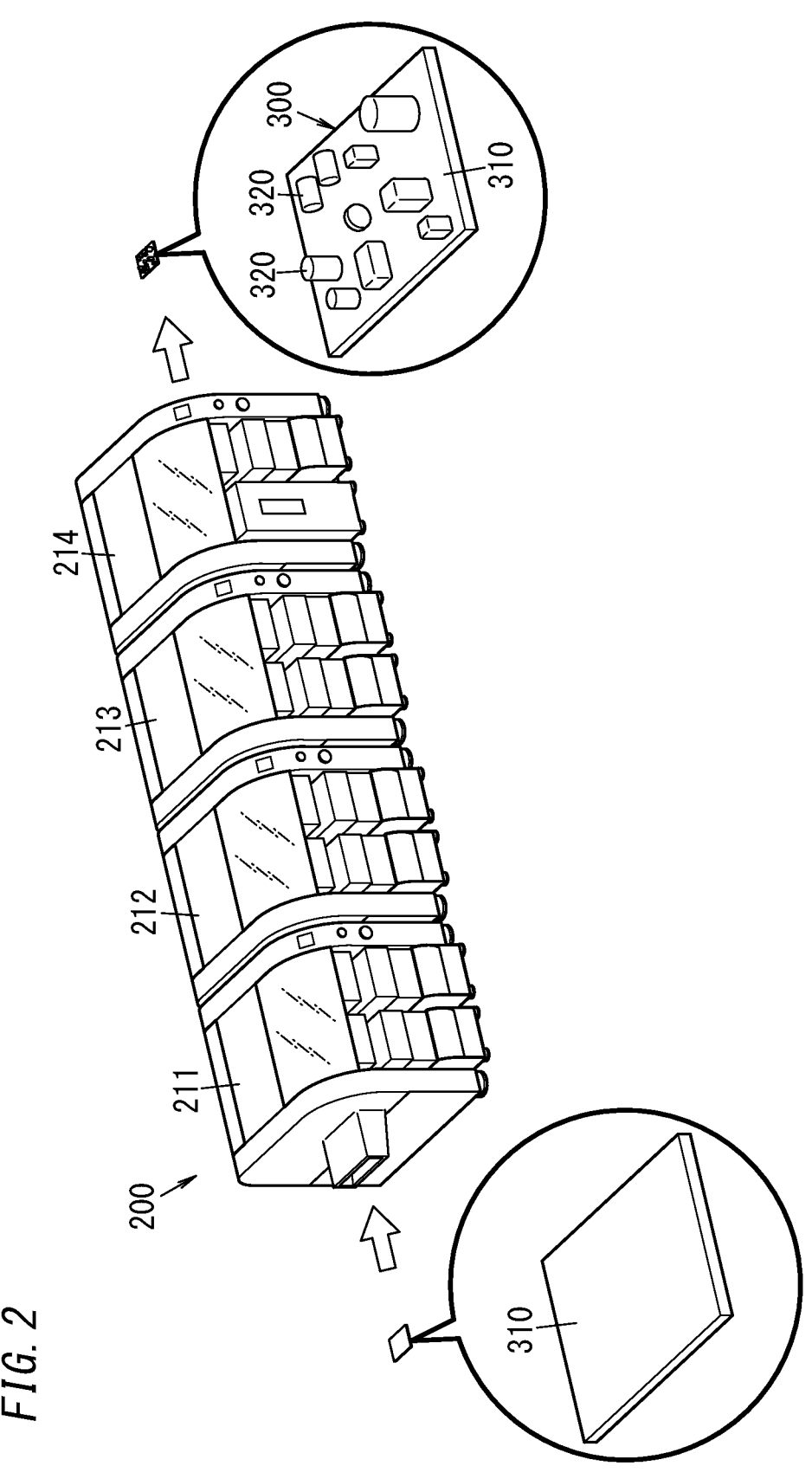
FIG. 2 illustrates a production system.

The first learning deliverable R1 may include at least one of a learned model or output based on the learned model. In this embodiment, the first learning deliverable R1 is a learned model for obtaining a particular result in response to the first data D1 that has been input. The particular result is control data for a production system 200 (see FIG. 2), and data, according to which production tact time of the mount board 300 will satisfy criteria. As shown in FIG. 2, the production system 200 includes a plurality (e.g., four in the example illustrated in FIG. 2) of mounters 211-214. The mounters 211-214 are used to arrange the electronic components 320 at predetermined locations on the board 310. In this embodiment, the control data includes information about assignment (assignment information) of the electronic components 320 to the mounters 211-214. That is to say, the assignment information indicates which of the mounters 211-214 is used to assign each of the plurality of electronic components 320 with respect to the mount board 300. For example, the control data represents a result of grouping of the plurality of electronic components 320. In other words, the plurality of electronic components 320 are classified into first to fourth groups corresponding to the mounters 211-

214, respectively. The result of grouping of the plurality of electronic components 320 may affect the time it takes for the production system 200 to produce the mount board 300 (tact time). The tact time is determined depending on a combination of the electronic components and the mounter. For example, the tact time is determined by the total traveling distance that a nozzle head of the mounter need to go to mount all electronic components. Appropriately grouping the plurality of electronic components 320 allows the time for producing the mount board 300 to be shortened, which would contribute to improving the production efficiency. From this point of view, the first learning deliverable R1 is preferably control data indicating the result of the best grouping of the plurality of electronic components 320. Therefore, the learned model that is the first learning deliverable R1 of the information processing system 100 is obtained by learning the relationship between the first data D1 and the control data so as to provide, in response to the first data D1 that has been input, the best control data for the production of the mount board 300 by the production system 200.

As shown in FIG. 1, the information processing system 100 includes the first system 10 and the second system 20. The first system 10 and the second system 20 are ready to communicate with each other. More specifically, the first system 10 and the second system 20 are ready to communicate with each other via a communications network 30. The communications network 30 may include the Internet. The communications network 30 does not have to be a network compliant with a single communications protocol but may also be made up of a plurality of networks compliant with mutually different communications protocols. The communications protocol may be selected from various types of well-known wired and wireless communications standard. The communications network 30 is shown in a simplified form in FIG. 1 but may include data communications devices such as a repeater hub, a switching hub, a bridge, a gateway, and a router.

As shown in FIG. 1, the first system 10 includes an input/output unit 11, a communications unit 12, and a processing unit 13.

The input/output unit 11 is an interface for inputting/outputting data. The input/output unit 11 enables input of the first data D1, and output of the first learning deliverable R1. The communications unit 12 serves as a communications interface. The communications unit 12 may be connected to the communications network 30 and has the function of establishing communication over the communications network 30. The communications unit 12 is compliant with a predetermined communications protocol. The predetermined communications protocol may be selected from various well-known wired and wireless communication standards. The processing unit 13 is configured to perform overall control on the first system 10, i.e., configured to control the input/output unit 11 and the communications unit 12. The processing unit 13 may be implemented as, for example, a computer system including one or more processors (microprocessors) and one or more memories. That is to say, the one or more processors perform the function of the processing unit 13 by executing a program (application) stored in the one or more memories. In this embodiment, the program is stored in advance in the one or more memories of the processing unit 13. However, this is only an example and should not be construed as limiting. The program may also be downloaded via a telecommunications line such as the Internet or distributed after having been stored in a non-transitory storage medium such as a memory card. The first system 10 like this may be implemented as a computer system.

As shown in FIG. 1, the second system 20 includes a communications unit 21 and a processing unit 22. The communications unit 21, as well as the communications unit 12, may be connected to the communications network 30, and has the function of establishing communication over the communications network 30. The communications unit 21 is compliant with a predetermined communications protocol. The predetermined communications protocol may be selected from various well-known wired and wireless communication standards. The processing unit 22 is configured to perform overall control on the second system 20, i.e., control the communications unit 21. The processing unit 22 may be implemented as, for example, a computer system including one or more processors (microprocessors) and one or more memories. That is to say, the one or more processors perform the function of the processing unit 22 by executing a program (application) stored in the one or more memories. In this embodiment, the program is stored in advance in the one or more memories of the processing unit 22. However, this is only an example and should not be construed as limiting. The program may also be downloaded via a telecommunications line such as the Internet or distributed after having been stored in a non-transitory storage medium such as a memory card. The second system 20 like this may be implemented as a computer system.

As shown in FIG. 1, the processing unit 13 of the first system 10 includes a transformation unit 131 and a generation unit 132. In FIG. 1, neither the transformation unit 131 nor the generation unit 132 has a substantive configuration but both the transformation unit 131 and the generation unit 132 represent functions to be performed by the processing unit 13. Moreover, as shown in FIG. 1, the processing unit 22 of the second system 20 includes a learning unit 221. The learning unit 221 does not have a substantive configuration but represents a function to be performed by the processing unit 22.

The transformation unit 131 is configured to transform the first data D1 into second data D2 and output the second data D2 to the second system 20. More specifically, the transformation unit 131 generates the second data D2 on receiving the first data D1 via the input/output unit 11 and transmits the second data D2 to the second system 20 via the communications unit 12. In this embodiment, the second data D2 is data without the specific information which is included in the first data D1. The first data D1 is data representing the mount board 300 (see FIGS. 2 and 3). As described above, the first data D1 may contain various types of information about the shapes and sizes of the board 310 and the plurality of electronic components 320, the types of the board 310 and the plurality of electronic components 320, the arrangement of the plurality of electronic components 320 on the board 310, and the arrangement of the electrical path (circuit pattern) of the board 310. The specific information is information which may be used only in the first system 10 but may not be used in the second system 20. In this embodiment, in the first data D1, each of various pieces of information about the types of the plurality of electronic components 320, the arrangement of the plurality of electronic components 320, and the arrangement of the electrical path (circuit pattern) on the board 310 is handled as the specific information. That is to say, the second data D2 may be the same data as the first data D1 except information about the types of the plurality of electronic components

320, the arrangement of the plurality of electronic components 320, and the arrangement of the electrical path on the board 310.

The transformation unit 131 generates the second data D2 by replacing the specific information of the first data D1 with alternative information which may be an alternative to the specific information. That is to say, the second data D2 includes the alternative information as an alternative to the specific information. As used herein, the alternative information may be information irrelevant to the specific information or may also be information obtained by performing a predetermined type of processing on the specific information. For example, if the specific information is information about the types of the plurality of electronic components 320, the alternative information may be information about alternative types of the plurality of electronic components 320. In that case, the transformation unit 131 performs, as a predetermined type of processing, the processing of changing the types of the plurality of electronic components 320 in accordance with a certain rule or randomly. Alternatively, if the specific information is information about the arrangement of the plurality of electronic components 320, the alternative information may be information about an alternative arrangement of the plurality of electronic components 320. In that case, the transformation unit 131 performs, as a predetermined type of processing, the processing of changing the arrangement of the plurality of electronic components 320 in accordance with a certain rule or randomly. Still alternatively, if the specific information is information about the arrangement of the electrical path on the board 310, the alternative information may be information showing, as information irrelevant to the specific information (i.e., information which is irrelevant to the contents of the first data D1), a state in which the board 310 has no electrical path.

Figure 3:
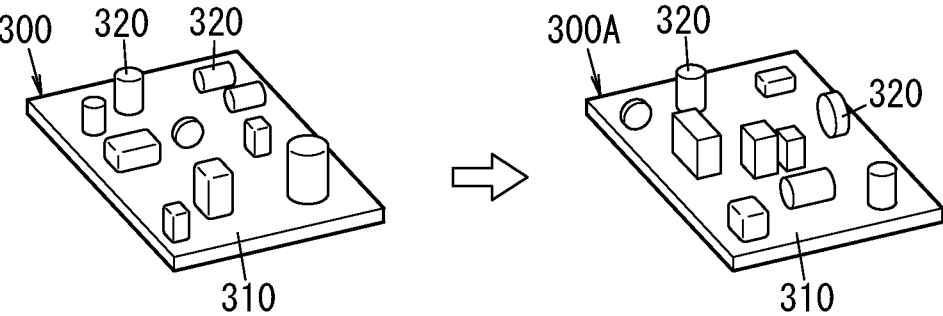
FIG. 3 illustrates transformation processing to be performed by the information processing system.

FIG. 3 illustrates the processing of transforming the first data D1 into the second data D2 to be performed by the transformation unit 131. In FIG. 3, the mount board 300 corresponds to the specifics represented by the first data D1, while the mount board 300A corresponds to the specifics represented by the second data D2. As can be seen from FIG. 3, the mount board 300A represented by the second data D2 is different from the mount board 300 represented by the first data D1. Therefore, no specific information (such as information about the types of the plurality of electronic components 320, the arrangement of the plurality of electronic components 320, and the arrangement of the electrical path on the board 310) can be extracted from the second data D2.

The learning unit 221 is configured to perform machine learning using the second data D2 provided by the first system 10 to generate the second learning deliverable R2 and output the second learning deliverable R2 to the first system 10. More specifically, the learning unit 221 generates the second learning deliverable R2 on receiving the second data D2 from the first system 10 and transmits the second learning deliverable R2 to the first system 10 via the communications unit 21. The second learning deliverable R2 may include at least one of a learned model or output based on the learned model. In this embodiment, the second learning deliverable R2 may include a learned model for obtaining a particular result in response to the second data D2 that has been input. The particular result is control data for the production system 200 (see FIG. 2), and data, according to which production tact time of the mount board 300 will satisfy criteria. As the machine learning, reinforcement learning (deep reinforcement learning, in particular) may be used. The learning unit 221 generates, by machine learning, the learned model that provides the control data in response to the second data D2 that has been input. Then, the learning unit 221 outputs, as the second learning deliverable R2, a learned model that provides control data that will result in the shortest tact time, to the first system 10. Note that as the method of the machine learning itself, well-known methods may be adopted, and therefore, description of the specific learning method will be omitted herein.

The generation unit 132 is configured to obtain, based on at least a part of the first data D1 and the second learning deliverable R2 provided by the second system 20, the first learning deliverable R1. More specifically, the generation unit 132 obtains, on receiving the second learning deliverable R2 from the second system 20 via the communications unit 12, the first learning deliverable R1 based on at least a part of the first data D1 and the second learning deliverable R2, and outputs the first learning deliverable R1 via the input/output unit 11. In this case, whether to use the first data D1 entirely or only partially depends on what type of first learning deliverable R1 is to be obtained. In this embodiment, the second learning deliverable R2 is a learned model obtained by the machine learning using the second data D2. The generation unit 132 obtains the first learning deliverable R1 by performing the machine learning using the first data D1 and the learned model included in the second learning deliverable R2. As the machine learning, reinforcement learning (deep reinforcement learning, in particular) is used. That is to say, the generation unit 132 uses, as a model for machine learning, the learned model generated by the second system 20, instead of a model on which no learning has been performed yet (unlearned model). Therefore, the first system 10 does not have to have processing capacity for performing the machine learning from the beginning. As the machine learning, reinforcement learning (deep reinforcement learning, in particular) is used as in the learning unit 221 of the second system 20. The generation unit 132 applies the first data D1 to the learned model, according to which the tact time with respect to the second data D2 will satisfy the criteria. In this manner, the generation unit 132 obtains, by machine learning, the learned model, according to which the tact time with respect to the first data D1 satisfies the criteria, as the first learning deliverable R1. Note that the first learning deliverable R1 does not have to be the learned model but may also be the best solution for the processing relevant to the first data D1. For example, the first learning deliverable R1 may be the control data for the first data D1 and data according to which the tact time satisfies the criteria (data that will provide the shortest tact time). The generation unit 132 may obtain a learned model by performing the machine learning using the first data D1 and the learned model included in the second learning deliverable R2. Then, the generation unit 132 may output, as the first learning deliverable R1, the control data obtained by introducing the first data D1 to this learned model.

1.3. Operation

Next, operation of the information processing system 100 will be briefly described with reference to the sequence chart shown in FIG. 4. The following example shows how the information processing system 100 may operate in a situation where the user 40 inputs the first data D1 to the first system 10 to obtain the first learning deliverable R1 from the first system 10.

When the user 40 inputs the first data D1 to the first system 10, the first system 10 transforms the first data D1 into the second data D2 and outputs the second data D2 to the second system 20. In this example, the second data D2 does not include the specific information unlike the first data D1. On receiving the second data D2 from the first system 10, the second system 20 performs the machine learning using the second data D2, thereby obtaining the second learning deliverable R2. The second system 20 outputs the second learning deliverable R2 to the first system 10. On receiving the second learning deliverable R2 from the second system 20, the first system 10 obtains the first learning deliverable R1 by using the first data D1 and the second learning deliverable R2. Then, the first system 10 provides the first learning deliverable R1 to the user 40.

The user 40 who has been provided with the first learning deliverable R1 by the information processing system 100 may obtain a particular result from the first data D1 by using the first learning deliverable R1. The particular result is the control data for a production system 200 (see FIG. 2), and the data that allows production tact time of the mount board 300 to satisfy the criteria. As a result, the production efficiency of the mount board 300 by the production system 200 may be improved.

1.4. Recapitulation

As can be seen from the foregoing description, an information processing system 100 is an information processing system for generating a first learning deliverable R1 based on first data D1 including specific information. The information processing system 100 includes a first system 10 and a second system 20 which are ready to communicate with each other. As shown in FIG. 1, the first system 10 includes a transformation unit 131 which transforms the first data D1 into second data D2, not including the specific information, and which outputs the second data D2 to the second system 20. The second system 20 includes a learning unit 221 which performs machine learning using the second data D2 provided by the first system 10 to generate a second learning deliverable R2 and output the second learning deliverable R2 to the first system 10. The first system 10 includes a generation unit 132 which obtains, based on at least a part of the first data D1 and the second learning deliverable R2 provided by the second system 20, the first learning deliverable R1. In this manner, the information processing system 100 allows increasing the learning effectiveness of machine learning while taking measures for preserving the information securely.

In other words, it can be said that the information processing system 100 performs the following method (information processing method). The information processing method is an information processing method for generating a first learning deliverable R1 based on first data D1 that includes specific information. The information processing method includes transforming the first data D1 into second data D2 that does not include the specific information, generating a second learning deliverable R2 by performing machine learning using the second data D2, and generating, based on at least a part of the first data D1 and the second learning deliverable R2, the first learning deliverable R1. In this manner, the information processing method, as well as the information processing system 100, allows increasing the learning effectiveness of machine learning while taking measures for preserving the information securely.

The information processing system 100 is implemented as a computer system (including one or more processors). That is to say, the information processing system 100 may have its function performed by having the one or more processors execute a program (computer program). This program is a program designed to cause the one or more processors to perform the information processing method. This program, as well as the information processing method, allows increasing the learning effectiveness of machine learning while taking measures for preserving information securely.

2. Variations

Note that the embodiment described above is only an exemplary one of various embodiments of the present disclosure and should not be construed as limiting. Rather, the exemplary embodiment may be readily modified in various manners depending on a design choice or any other factor without departing from the scope of the present disclosure. Next, variations of the exemplary embodiment will be enumerated one after another.

In one variation, the second learning deliverable R2 may include a plurality of learning deliverables which are obtained by machine learning using the second data D2. For example, the learning unit 221 generates, by machine learning, a learned model which provides control data in response to the second data D2 that has been input. The learning unit 221 obtains, as the learning deliverables, a plurality of learned models that provide control data, according to which the tact time will satisfy a predetermined criteria. The learning unit 221 outputs, as the second learning deliverable R2, the plurality of learned models (learning deliverables) to the first system 10. In this case, the generation unit 132 may adopt, as the first learning deliverable R1, one of the plurality of learned models included in the second learning deliverable R2. For example, the generation unit 132 selects, based on the evaluation results of the plurality of learning deliverables obtained by using the first data, a model to be suitably used as the first learning deliverable R1 from the plurality of learned models. The generation unit 132 obtains control data by introducing the first data D1 to the plurality of learning deliverables, and adopts, as the first learning deliverable R1, a learning deliverable which provides control data that will result in the shortest tact time. In this case, there is no need for the generation unit 132 to perform the machine learning unlike the embodiment described above, thus allowing reducing a processing load on the first system 10.

Note that the plurality of learning deliverables may be control data obtained from a learned model, instead of the learned model itself. For example, the learning unit 221 generates, by machine learning, a learned model which provides control data in response to the second data D2 that has been input. The learning unit 221 generates, based on the learned model, multiple items of control data according to which the tact time will satisfy predetermined criteria, as the learning deliverable. The learning unit 221 outputs, as the second learning deliverable R2, the multiple items of control data (learning deliverable) to the first system 10. In this case, the generation unit 132 adopts, as the first learning deliverable R1, one of the multiple items of control data included in the second learning deliverable R2. For example, the generation unit 132 selects, based on the evaluation results of the plurality of learning deliverables obtained by using the first data, an item of control data to be suitably used as the first learning deliverable R1 from the multiple items of control data. The generation unit 132 evaluates the tact time based on the first data D1 and the control data, and adopts, as the first learning deliverable R1, a learning deliverable (control data) that will result in the shortest tact time. In this case, the first learning deliverable R1 is not the learned model but the best solution for the processing relevant to the first data D1.

In another variation, the transformation unit 131 may generate the second data D2 by simply removing the specific information from the first data D1. Nevertheless, replacing the specific information with alternative information is a better choice in order to use the first data D1 and the second data D2 in the same form.

In still another variation, the control data may include, as an alternative or in addition to the information about assignment of the electronic components 320 to the mounters 211-214, at least one type of information out of information about the order in which the electronic components 320 are arranged or information about the order in which the electronic components 320 are mounted on the board 310.

In yet another variation, the production system 200 may include an additional piece of equipment other than the mounter or may include no mounters. That is to say, the production system 200 may include at least one type of equipment selected from the group consisting of mounters, insertion machines (e.g., a high-speed axial component insertion machine, a high-speed jumper wire insertion machine, and a high-density radial component insertion machine), chip mounters, screen printers, and laser markers.

In yet another variation, the information processing system 100 is also applicable to generating data for various types of systems other than the production system 200. For example, the information processing system 100 may provide, as the first learning deliverable R1, a learned model for an authentication system. In this variation, the first learning deliverable R1 may be a learned model which provides a result of authentication or identification in response to the first data D1 that has been input. For example, there are various types of identification such as authentication of persons, identification of persons, authentication of creatures (e.g., animals such as cats and dogs), and identification of objects (e.g., cars). The following example is how to identify a person using this system 100. In this case, the first data D1 is an image of a person. The specific information may be information about the privacy of the person. Examples of the specific information include information about parts of the person's face (e.g., eyes, nose, mouth). In the first system 10, the transformation unit 131 generates, based on the given first data D1, second data D2 that does not include the specific information. For example, the transformation unit 131 may generate the second data D2 by partially replacing the image of the person's face with another image as alternative information. Then, the first system 10 outputs the second data D2 to the second system 20. In this variation, the first system 10 transforms multiple items of first data D1 into multiple items of second data D2 and outputs the multiple items of second data D2 to the second system 20. In response, in the second system 20, the learning unit 221 performs machine learning on the second data D2, thereby generating a learned model. Then, the second system 20 outputs, as the second learning deliverable R2, the learned model to the first system 10. As the machine learning to be performed at this stage, deep learning with or without a teacher may be appropriately used. The first system 10 obtains the first learning deliverable R1 based on the first data D1 and the second learning deliverable R2. The first system 10 performs machine learning using the first data D1 on the learned model that is the second learning deliverable R2, thereby generating a learned model. Then, the first system 10 provides the learned model as the first learning deliverable R1. As the machine learning to be performed at this stage, deep learning with or without a teacher may be used appropriately as in the second system 20. In this manner, the information processing system 100 may make the first system 10 generate a learned model for identifying a person even without passing the specific information included in the first data D1 from the first system 10 to the second system 20. Note that the generation unit 132 may select, if the second system 20 provides the second learning deliverable R2 including, as the learning deliverable, a plurality of learned models for the first system 10, a learned model to be used as the first learning deliverable R1 from the plurality of learned models. For example, the generation unit 132 identifies, based on the plurality of learned models provided, the person by using the first data D1 and adopts a learned model with the best evaluation as the first learning deliverable R1.

More specifically, the first data D1 includes a plurality of face images for use in person identification and identification information indicating whose face each of the plurality of face images represents. The number of the face images used is not particularly limited, but many face images are preferably used. The first system 10 generates second data D2 including an image, obtained by blacking out the eye part of each face image included in the first data D1, and the identification information of the face image and outputs the second data to the second system 20. In this case, the specific information is information about the eye part of the face image. In the second system 20, the learning unit 221 performs the machine learning on the second data D2, thereby generating a learned model for identifying a person. Then, the second system 20 outputs, as the second learning deliverable R2, the learned model to the first system 10. In response, the first system 10 performs, by using the given second learning deliverable R2 as an initial value for a learned model, machine learning using the first data D1 as learning data. Then, the first system 10 outputs, as the first learning deliverable R1, a learned model updated by the machine learning. Alternatively, the first system 10 may output, when the user requests person identification with respect to a particular image, an identification result, obtained by the updated learned model, as the first learning deliverable R1. Note that the first system 10 may use, when converting the first data D1 to the second data D2, an image of which the eye part is replaced with a common eye image as an alternative to the face image, of which the eye part is blacked out. The second learning deliverable R2 does not have to be the learned model but may also be, when the user requests person identification with respect to a particular image, an identification result presenting top N candidates for the person to be identified which are obtained from the learned model. Specifically, when N=3, the second learning deliverable R2 may be the identification result presenting Persons X, Y, and Z. The generation unit 132 searches the top N candidates for the identification information of a person, whose eye feature quantity (i.e., feature quantity obtained from the specific information) is closest to that of the image for which the person identification is requested, and outputs the person's identification information as the first learning deliverable R1. In this case, the eye feature quantity may be types of information about, for example, the ratio of eye width to face width and whether the eyes are located near or far from the nose. In the example described above, the specific information is information about the eye part of the face image. However, the specific information is not limited to this, but may also be any particular part of the face image. Examples of the particular parts include eyes, nose, mouth, ears, eyebrows, and combinations thereof.

In yet another variation, the information processing system 100 may include a plurality of first systems 10. In that case, the specific information is held in each of the first systems 10 and is not transmitted to the second system 20. Therefore, even if the plurality of first systems 10 are used by multiple different users, information may be preserved appropriately. In addition, as the second system 20, a computer system having high computing power may be used for the purpose of machine learning. Alternatively, the second system 20 may perform learning, even if individual first systems 10 are operated by different organizations or operators and the size of the teacher data held by the individual first systems 10 is small, by collecting multiple items of first data D1 of the plurality of first systems 10. This allows improving the learning performance.

In yet another variation, the information processing system 100 may be implemented as a system for determining the name of a patient's disease based on the patient's diagnostic image (e.g., X-ray images, CT images, MRI images, and pathological images) and medical record information including his or her identification information (e.g., patient's age and race). As for a disease from which only a small number of patients are suffering, it is difficult to collect a plenty of medical record information about the disease. Moreover, if the information about the patient's age and race included in the medical record information and the name of the patient's disease are disclosed, then the patient could be easily identified by the medical record, since only a small number of patients are suffering from the disease.

More specifically, the information processing system 100 may be implemented as a system for estimating the name of the patient's disease based on the medical record information. In that case, the first data D1 is learned data including the medical record information and the identification information indicating the name of a patient's disease by the medical record information. The first system 10 generates the second data D2 by removing, from the first data D1, the specific information such as information about the patient's age and race that belongs to his or her privacy and that could possibly be misused to identify him or her. Then, the first system 10 outputs the second data D2 to the second system 20. In the second system 20, the learning unit 221 generates, using the second data D2, a learned model for determining the disease name. Then, the second system 20 outputs, as the second learning deliverable R2, the learned model to the first system 10. The first system 10 acquires, based on the learned model provided as the second learning deliverable R2, top N candidates for the disease name with respect to the medical record information designated by the user. The first system 10 rearranges the above N candidates in the descending order in which patients, belonging to the age group written on the medical record information designated by the user, are likely to catch the disease. Then, the first system 10 outputs, as the first learning deliverable R1, the top N candidates that are rearranged. As an alternative or in addition to this, the first system 10 may rearrange the top N candidates in the descending order in which patients of the race, written on the medical record information designated by the user, are likely to catch the disease. Then, the first system 10 may output, as the first learning deliverable R1, the top N candidates that are rearranged. Note that the order of the names of the diseases that patients of respective age groups or races are likely to catch may be stored in a database in advance.

The first system 10 may be a system to have a network, in which identification information including the patient's age and race is added to an input layer of a learned model as the second learning deliverable R2, learn by using the first data D1. In general, a convolution neural network (CNN) is used for deep learning by which an image is used as input data for identification purposes. The CNN is a network made up of a first part which creates a feature map based on an input image obtained from a convolutional layer and a pooling layer, and a second part which obtains, through a fully connected layer, final output from the feature map. In this variation, the second system 20 creates, as the second learning deliverable R2, a learned model by the CNN with an X-ray image used as an input image. When performing the machine learning using the first data D1, the first system 10 establishes, based on the second learning deliverable R2, a network having a different structure from the second learning deliverable R2. The generation unit 132 establishes, as the first learning deliverable R1, a network to which the identification information indicating the patient's age and race, as well as the X-ray image, has been entered as input data. The network established by the generation unit 132, as well as the second learning deliverable R2, is also a CNN and also made up of the first part and the second part. The first part of the first learning deliverable R1 is the same as the first part of the second learning deliverable R2. On the other hand, the second part of the first learning deliverable R1 uses, in addition to the feature map obtained by the first part, the identification information indicating the patient's age and race as the input data. The generation unit 132 generates the first learning deliverable R1 by performing the machine learning using the first data D1.

In yet another variation, the information processing system 100 (the first system 10 and the second system 20) may include a plurality of computers. For example, the functions of the information processing system 100 (in particular, the transformation unit 131, the generation unit 132, and the learning unit 221) may be distributed in multiple different devices. Alternatively, at least some functions of the second system 20 may be implemented as, for example, a cloud (cloud computing system) as well. Nevertheless, from a point of view of the preservation of information, the cloud (cloud computing system) is preferably not used as the first system 10.

The agent that performs the functions of the information processing system 100 (including the first system 10 and the second system 20) described above includes a computer system. The computer system may include, as hardware components, a processor and a memory. The functions to be performed by the information processing system 100 according to the present disclosure that plays the role of such an agent are carried out by making the processor execute a program stored in the memory of the computer system. The program may be stored in advance in the memory of the computer system. Alternatively, the program may also be downloaded through a telecommunications line or be distributed after having been recorded in some non-transitory storage medium such as a memory card, an optical disc, or a hard disk drive, any of which is readable for the computer system. The processor of the computer system may be implemented as a single or a plurality of electronic circuits including a semiconductor integrated circuit (IC) or a large-scale integrated circuit (LSI). Optionally, a field-programmable gate array (FPGA) to be programmed after an LSI has been fabricated, an application specific integrated circuit (ASIC), or a reconfigurable logic device allowing the connections or circuit sections inside of an LSI to be reconfigured may also be adopted as the processor. Those electronic circuits may be either integrated together on a single chip or distributed on multiple chips, whichever is appropriate.

Those multiple chips may be integrated together in a single device or distributed in multiple devices without limitation.

3. Aspects

As can be seen from the foregoing description of embodiments and their variations, the present disclosure has the following aspects. In the following description, reference signs are inserted in parentheses just for the sake of clarifying correspondence in constituent elements between the following aspects of the present disclosure and the exemplary embodiments described above.

A first aspect is an information processing system (100) for generating a first learning deliverable (R1) based on first data (D1) including specific information. The information processing system (100) includes a first system (10) and a second system (20) which are ready to communicate with each other. The first system (10) includes a transformation unit (131) which transforms the first data (D1) into second data (D2) not including the specific information and outputs the second data (D2) to the second system (20). The second system (20) includes a learning unit (221) which performs machine learning using the second data (D2) provided by the first system (10) to generate a second learning deliverable (R2) and outputs the second learning deliverable (R2) to the first system (10). The first system (10) includes a generation unit (132) which obtains, based on at least a part of the first data (D1) and the second learning deliverable (R2) provided by the second system (20), the first learning deliverable (R1). This aspect allows increasing the learning effectiveness of machine learning while taking measures for preserving information securely.

A second aspect is a specific implementation of the information processing system (100) according to the first aspect. In the second aspect, the second learning deliverable (R2) includes a learned model obtained by the machine learning using the second data (D2). This allows increasing the learning effectiveness of machine learning while taking measures for preserving information securely.

A third aspect is a specific implementation of the information processing system (100) according to the second aspect. In the third aspect, the generation unit (132) performs the machine learning using the first data (D1) and the learned model included in the second learning deliverable (R2). This aspect allows generating, based on the learned model generated by the second system (20), a learned model more suitable for the first data (D1).

A fourth aspect is a specific implementation of the information processing system (100) according to the first aspect. In the fourth aspect, the second learning deliverable (R2) includes a plurality of learning deliverables obtained by the machine learning using the second data (D2). This aspect allows increasing the learning effectiveness of machine learning while taking measures for preserving the information securely.

A fifth aspect is a specific implementation of the information processing system (100) according to the fourth aspect. In the fifth aspect, the first learning deliverable (R1) is selected, based on evaluation results of the plurality of learning deliverables obtained by using the first data (D1), from the plurality of learning deliverables. This aspect allows reducing a processing load on the first system (10).

A sixth aspect is a specific implementation of the information processing system (100) according to any one of first to fifth aspects. In the sixth aspect, the second data (D2) includes alternative information to be an alternative to the specific information. This aspect facilitates application of the first data (D1) to the second learning deliverable (R2).

A seventh aspect is a specific implementation of the information processing system (100) according to the sixth aspect. In the seventh aspect, the alternative information is information having no relativity to the specific information. This aspect allows preserving the information more securely.

An eighth aspect is a specific implementation of the information processing system (100) according to the sixth aspect. In the eighth aspect, the alternative information is information obtained by performing predetermined processing on the specific information. This aspect allows preserving the information even more securely.

A ninth aspect is a specific implementation of the information processing system (100) according to any one of the first to eighth aspects. In the ninth aspect, the first learning deliverable (R1) is either a learned model for obtaining a particular result in response to the first data (D1) that has been input or an optimal solution for processing relevant to the first data (D1). This aspect allows increasing the learning effectiveness of machine learning while taking measures for preserving information securely.

A tenth aspect is a specific implementation of the information processing system (100) according to any one of the first to ninth aspects. In the tenth aspect, the first data (D1) is data representing a mount board (300) where a plurality of electronic components (320) are mounted on a board (310). The specific information includes at least one type of information selected from the group consisting of: information about types of the plurality of electronic components (320); information about an arrangement of the plurality of electronic components (320); and information about an arrangement of an electrical path on the board (310). This aspect allows obtaining data for optimizing the production efficiency of the mount board (300).

An eleventh aspect is a specific implementation of the information processing system (100) according to any one of the first to tenth aspects. In the eleventh aspect, the information processing system (100) includes a plurality of first systems (10), one of which is the first system (10). This aspect allows increasing the learning effectiveness of machine learning while taking measures for preserving information securely.

A twelfth aspect is a computer system which functions as the first system (10) of the information processing system (100) of any one of first to eleventh aspects. This aspect allows increasing the learning effectiveness of machine learning while taking measures for preserving information securely.

A thirteenth aspect is a computer system which functions as the second system (20) of the information processing system (100) of any one of first to eleventh aspects. This aspect allows increasing the learning effectiveness of machine learning while taking measures for preserving information securely.

A fourteenth aspect is an information processing method for generating a first learning deliverable (R1) based on first data (D1) including specific information. The information processing method includes transforming the first data (D1) into second data (D2) that does not include the specific information. The information processing method also includes generating a second learning deliverable (R2) by performing machine learning using the second data (D2). The information processing method further includes obtaining, based on the first data (D1) and the second learning deliverable (R2), the first learning deliverable (R1). This aspect allows increasing the learning effectiveness of machine learning while taking measures for preserving information securely. In particular, in the fourteenth aspect, the information processing method includes making the first system (10) transform the first data (D1) into second data (D2) that does not include the specific information. The information processing method also includes generating the second learning deliverable (R2) by making a second system (20), different from the first system (10), perform machine learning using the second data (D2). In addition, the information processing method may further include making the first system (10) obtain, based on at least a part of the first data (D1) and the second learning deliverable (R2), the first learning deliverable (R1). This aspect allows increasing the learning effectiveness of machine learning while taking measures for preserving information securely.

A fifteenth aspect is a program designed to cause one or more processors to perform the processing method according to the fourteenth aspect. This aspect allows increasing the learning effectiveness of machine learning while taking measures for preserving information securely.

REFERENCE SIGNS LIST

1 Information Processing System
10 First System
131 Transformation Unit
132 Generation Unit
20 Second System
221 Learning Unit
300 Mount Board
310 Board
320 Electronic Component
D1 First Data
R1 First Learning Deliverable
D2 Second Data
R2 Second Learning Deliverable

The invention claimed is:

1. An information processing system configured to generate a first learning deliverable based on first data and control a component mounter using the first learning deliverable, the first data including specific information, the information processing system comprising:

a first system and a second system which are configured to be ready to communicate with each other, wherein the first system comprises a first processor coupled to one or more first memories and configured to perform first operations, the second system comprises a second processor coupled to one or more second memories and configured to perform second operations, the first operations comprise transforming the first data into second data not including the specific information and outputting the second data to the second system, the second operations comprise:

performing machine learning using the second data provided by the first system to generate a second learning deliverable and output the second learning deliverable to the first system by obtaining, as the second learning deliverable and by the machine learning using the second data, a plurality of learning deliverables, the plurality of learning deliverables being configured to provide respective control data, according to each of which a tact time will satisfy a predetermined criterion, the first operations further comprise:

obtaining, based on at least a part of the first data and the second learning deliverable provided by the second system, the first learning deliverable, selecting, based on evaluation results of the plurality of learning deliverables performed by using the first data, the first learning deliverable from the plurality of learning deliverables by introducing the first data to the plurality of learning deliverables to obtain respective control data, and adopting, as the first learning deliverable, a learning deliverable from the plurality of learning deliverables which provides control data that will result in the shortest tact time, generating a drive signal based on the control data, and transmitting the drive signal to the component mounter to cause the component mounter to pick up a plurality of electronic components and move a nozzle head to mount the plurality of electronic components onto a board in an order defined by the control data.

2. The information processing system of claim 1, wherein the second data includes alternative information to be an alternative to the specific information.

3. The information processing system of claim 2, wherein the alternative information is information having no relativity to the specific information, the first data is data representing a mount board where a plurality of electronic components are mounted on a board, the specific information includes information about an arrangement of an electrical path on the board, and the alternative information includes information showing, as information irrelevant to the specific information, a state in which the board has no electrical path.

4. The information processing system of claim 2, wherein the alternative information is information obtained by performing predetermined processing on the specific information.

5. The information processing system of claim 1, wherein the first learning deliverable is either a learned model for obtaining a particular result in response to the first data that has been input or an optimal solution for processing relevant to the first data.

6. The information processing system of claim 1, wherein the first data is data representing a mount board where a plurality of electronic components are mounted on a board, and the specific information includes at least one type of information selected from the group consisting of: information about types of the plurality of electronic components; information about an arrangement of the plurality of electronic components; and information about an arrangement of an electrical path on the board.

7. The information processing system of claim 1, comprising a plurality of first systems, one of which is the first system.

8. An information processing method for generating a first learning deliverable based on first data and controlling a component mounter using the first learning deliverable, the first data including specific information, the information processing method comprising:

transforming the first data into second data that does not include the specific information;

generating a second learning deliverable by performing machine learning using the second data; and obtaining, based on at least a part of the first data and the second learning deliverable, the first learning deliverable, wherein the generating the second learning deliverable comprises obtaining, as the second learning deliverable and by the machine learning using the second data, a plurality of learning deliverables, the plurality of learning deliverables being configured to provide respective control data, according to each of which a tact time will satisfy a predetermined criterion, and the obtaining the first learning deliverable comprises selecting, based on evaluation results of the plurality of learning deliverables performed by using the first data, the first learning deliverable from the plurality of learning deliverables by introducing the first data to the plurality of learning deliverables to obtain respective control data, and adopting, as the first learning deliverable, a learning deliverable from the plurality of learning deliverables which provides control data that will result in the shortest tact time, the method further comprises:

generating a drive signal based on the control data, and transmitting the drive signal to the component mounter to cause the component mounter to pick up a plurality of electronic components and move a nozzle head to mount the plurality of electronic components onto a board in an order defined by the control data.

9. A non-transitory storage medium storing a program designed to cause one or more processors to perform the information processing method of claim 8.

* * * * *